United States Patent
Boyd

(10) Patent No.: US 11,405,731 B1
(45) Date of Patent: Aug. 2, 2022

(54) MICROELECTROMECHANICAL SYSTEM

(71) Applicant: AAC ACOUSTIC TECHNOLOGIES (SHENZHEN) CO., LTD., Shenzhen (CN)

(72) Inventor: Euan James Boyd, Eb (GB)

(73) Assignee: AAC Acoustic Technologies (Shenzhen) Co., Ltd., Shenzhen (CN)

(*) Notice: Subject to any disclaimer, the term of this patent is extended or adjusted under 35 U.S.C. 154(b) by 0 days.

(21) Appl. No.: 17/214,953

(22) Filed: Mar. 29, 2021

(51) Int. Cl.
*H04R 19/00* (2006.01)
*H04R 19/04* (2006.01)
*B81B 3/00* (2006.01)

(52) U.S. Cl.
CPC ........... *H04R 19/04* (2013.01); *B81B 3/0021* (2013.01); *B81B 3/0067* (2013.01); *B81B 2201/0257* (2013.01); *B81B 2203/0127* (2013.01)

(58) Field of Classification Search
CPC ..... H04R 19/04; B81B 3/0021; B81B 3/0067; B81B 2201/0257; B81B 2203/0127
See application file for complete search history.

(56) References Cited

U.S. PATENT DOCUMENTS

| | | | | |
|---|---|---|---|---|
| 9,828,237 | B2* | 11/2017 | Walther | H04R 19/005 |
| 2018/0091906 | A1* | 3/2018 | Khenkin | H04R 19/04 |
| 2018/0234774 | A1* | 8/2018 | Walther | H04R 19/005 |

* cited by examiner

*Primary Examiner* — Matthew A Eason
(74) *Attorney, Agent, or Firm* — W&G Law Group

(57) ABSTRACT

A microelectromechanical system includes a spacer layer, a first corrugated conductive diaphragm, and a second corrugated conductive diaphragm. The spacer layer includes counter electrode walls, slots and support walls extending along a first direction. The counter electrode walls, slots and support walls are arranged alternately in a second direction. The first corrugated conductive diaphragm includes first crests and first troughs arranged alternately in the second direction. The second corrugated conductive diaphragm includes second crests and second troughs arranged alternately in the second direction. The spacer layer is received in a cavity formed by the first and second corrugated conductive diaphragms. The support walls are respectively sandwiched between the aligned first troughs and second crests. The counter electrode walls are respectively suspended in the corresponding chambers formed between the aligned first crests and second troughs. The microelectromechanical system of the present disclosure has a high level of acoustic compliance and sensitivity.

20 Claims, 5 Drawing Sheets

MICROELECTROMECHANICAL SYSTEM

FIELD OF THE INVENTION

The present disclosure relates to the field of electro-acoustic conversion devices, and in particular, to a microelectromechanical system for an electro-acoustic conversion device.

BACKGROUND

A current microelectromechanical system microphone applies dual membranes disposed at opposite sides of a counter electrode. A sealed volume formed between the dual membranes can be at a pressure different from the surrounding atmosphere. If the pressure within the sealed volume is reduced to significantly below atmospheric pressure i.e. less than 10% of atmospheric pressure, the acoustic damping associated with the airflow through the counter electrode will be reduced significantly. The reduction of the acoustic damping results in an increase in microphone SNR (Signal to Noise Ratio). The current microelectromechanical system microphone applies two planar membranes connected together through an array of pillars.

However, since the pressure within the sealed volume is less than the atmospheric pressure, there will be a significant pressure difference across the membranes, which causes the membrane to deform between the pillars and generate localised tensile stress which increases the stiffness of the membrane. This makes it a significant challenge to design a dual membrane structure which minimises the deformation between the pillars but also allows the dual membrane structure to respond to an incoming acoustic pressure.

Therefore, it is desired to provide an improved microelectromechanical system which can overcome at least one of the above problems.

SUMMARY

In one aspect, the present disclosure provides a microelectromechanical system which comprises a spacer layer, a first corrugated conductive diaphragm and a second corrugated conductive diaphragm. The spacer layer comprises a plurality of counter electrode walls and support walls extending along a first direction. The counter electrode walls and support walls are arranged alternately in a second direction. Slots are formed between adjacent counter electrode walls and support walls to separate the support walls from the counter electrode walls respectively. The first corrugated conductive diaphragm comprises a plurality of first crests and first troughs arranged alternately in the second direction. The second corrugated conductive diaphragm comprises a plurality of second crests and second troughs arranged alternately in the second direction. The first corrugated conductive diaphragm and the second corrugated conductive diaphragm are respectively located at opposite sides of the spacer layer to cooperatively form a cavity, the first crests are respectively aligned with the second troughs and the first troughs are respectively aligned with the second crests. The spacer layer is received in the cavity. The support walls are respectively sandwiched between the aligned first troughs and second crests. Sealed chambers are respectively formed between the aligned first crests and second troughs and adjacent support walls. The counter electrode walls are respectively suspended in the corresponding sealed chambers.

In some embodiments, the chambers are hermetically sealed, with an inside pressure less than an external atmosphere.

In some embodiments, the chambers are vacuum.

In some embodiments, the counter electrode wall comprises a first surface facing the first corrugated conductive diaphragm and a second surface facing the second corrugated conductive diaphragm, conductive elements being respectively disposed on the first and second surfaces such that a first capacitance is formed between the first corrugated conductive diaphragm and the conductive elements disposed on the first surface of the spacer layer and a second capacitance is formed between the second corrugated conductive diaphragm and the conductive elements disposed on the second surface of the spacer layer.

In some embodiments, the first crests and troughs are evenly distributed in the second direction.

In some embodiments, distances between adjacent support walls are greater than 20 um.

In some embodiments, the first crests and troughs are arranged in concentric arcs.

In some embodiments, the first crests and first troughs extend arcuately along the first direction, adjacent first crests being spaced from each other and adjacent first troughs being spaced from each other such that a spoke extending along the second direction is formed therebetween.

In some embodiments, each of the first crests and troughs spans an arc of substantially 60 degrees.

In some embodiments, the first corrugated conductive diaphragm has a circular configuration and comprises a plurality of sections each comprising a group of first crests and first troughs arranged alternately in the second direction, adjacent sections being connected with each other via a spoke which extends along a diameter direction of the first corrugated conductive diaphragm.

In some embodiments, a first groove is formed at a surface of the first trough away from the spacer layer.

In some embodiments, the spacer layer further comprises a plurality of spokes extending in the second directions, the counter electrode walls being respectively connected between adjacent spokes, the support walls being disconnected from the counter electrode walls and the spokes by the slots.

In some embodiments, the spacer layer has a circular configuration and comprises a plurality of sections each comprising a group of the counter electrode walls and support walls being arranged alternately in the second direction, adjacent sections being connected with each other via a spoke which extends along a diameter direction of the spacer layer, the counter electrode walls being respectively connected between adjacent spokes, the support walls being disconnected from the counter electrode walls and the spokes by the slots.

In another aspect, the present invention provides an electro-acoustic conversion device comprising the microelectromechanical system described above, and an ASIC electrically connected to the microelectromechanical system.

BRIEF DESCRIPTION OF THE DRAWINGS

In order to explain the technical solutions of the embodiments of the present disclosure more clearly, accompanying drawings used to describe the embodiments are briefly introduced below. It is evident that the drawings in the following description are only concerned with some embodiments of the present disclosure. For those skilled in the art, in a case where no inventive effort is made, other drawings may be obtained based on these drawings.

FIG. 1 illustrates a microelectromechanical system in accordance with an exemplary embodiment of the present disclosure.

DESCRIPTION OF THE EMBODIMENTS

Figure 1:
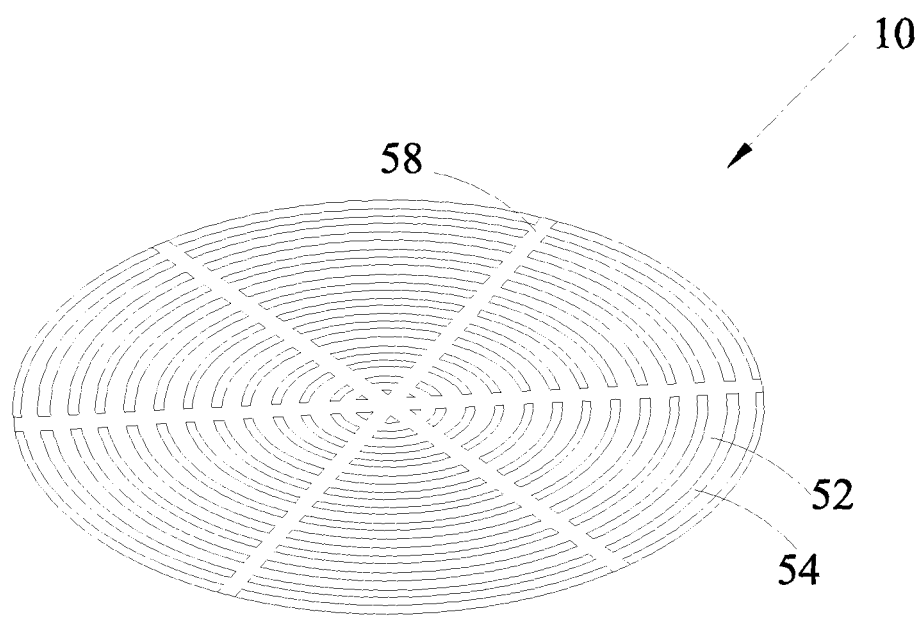

The present disclosure will be further illustrated with reference to the accompanying drawings. It shall be noted that the elements of similar structures or functions are represented by like reference numerals throughout the figures. The embodiments described herein are not intended as an exhaustive illustration or description of various other embodiments or as a limitation on the scope of the claims or the scope of some other embodiments that are apparent to one of ordinary skills in the art in view of the embodiments described in the Application. In addition, an illustrated embodiment need not have all the aspects or advantages shown.

Figure 2:
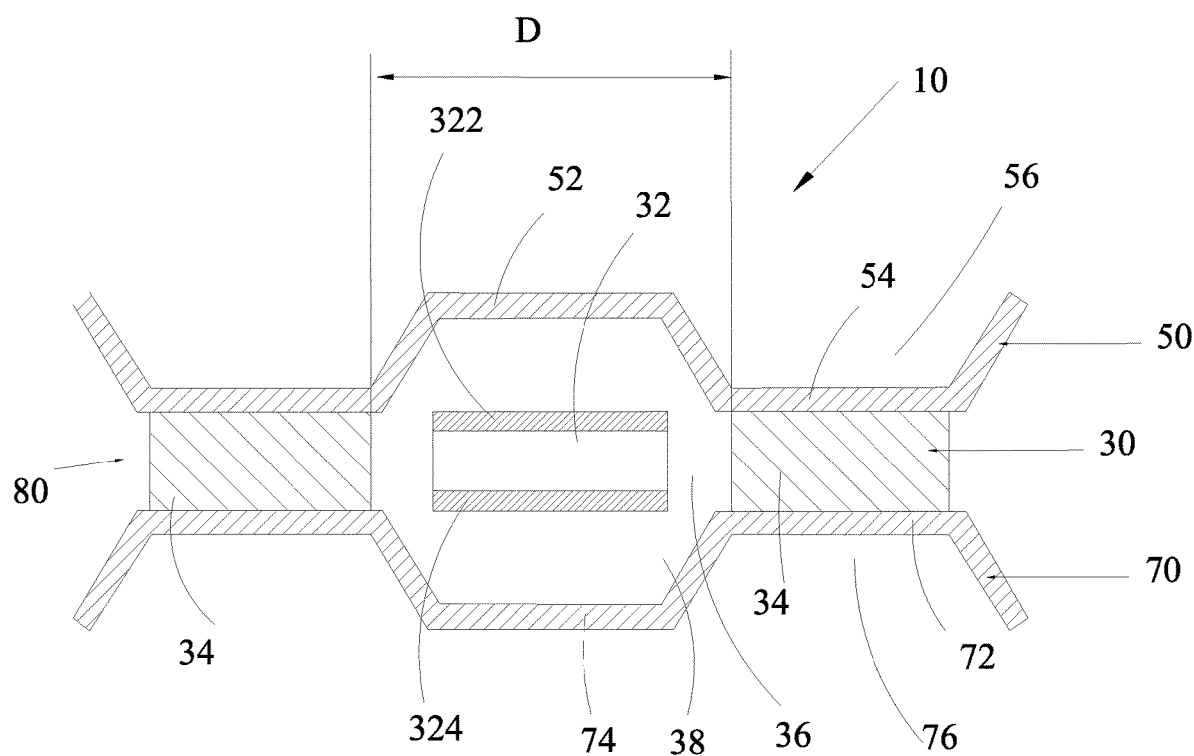
FIG. 2 is a cross-sectional view of a portion of the microelectromechanical system of FIG. 1.

Referring to FIG. 1 and FIG. 2, a microelectromechanical system 10 comprises a spacer layer 30, a first corrugated conductive diaphragm 50 and a second corrugated conductive diaphragm 70 respectively disposed at opposite sides of the spacer layer 30.

The spacer layer 30 is located within a cavity 80 formed between the first and second diaphragms 50, 70. The spacer layer 30 comprises a plurality of counter electrode walls 32, support walls 34 and slots 36 located between adjacent counter electrode walls 32 and support walls 34. Electrically conductive elements 322, 324 acting as counter electrodes are respectively disposed on opposite first and second surfaces of the counter electrode walls 32. The spacer layer 30 further comprises a plurality of spokes 37 configured to mount the counter electrode walls 32 to a base of an electro-acoustic conversion device 100 (shown in FIG. 4). The slots 36 surround the corresponding counter electrode walls 32 respectively and pass through the spacer layer 30 in a depth direction of the spacer layer 30 to thereby separate the support walls 34 from the counter electrode walls 32 and the spokes 37 respectively. The counter electrode walls 32 and support walls 34 extend along a first/circumferential/longitudinal direction. The counter electrode walls 32, slots 36 and support walls 34 are arranged alternately in a second/radial/transverse direction. The spokes 37 extend in the second/radial/transverse direction. The support walls 34 may be integrally formed with one of the first corrugated conductive diaphragm 50 and second corrugated conductive diaphragm 70. Alternatively, the support walls 34 are formed between the first troughs 54 and the second crest 72 after the first corrugated conductive diaphragm 50 and second corrugated conductive diaphragm 70 are assembled together. Alternatively, the support walls 34 may be integrally formed with the counter electrode walls 32 and then the slots 36 are formed to separate the support walls 34 from the counter electrode walls 32.

The first corrugated conductive diaphragm 50 comprises a plurality of first crests 52 and first troughs 54 arranged alternately in the second direction. The first troughs 54 are sunk from adjacent first crests 52 toward the spacer layer 30. A first groove 56 is accordingly formed at a surface of the first trough 54 away from the spacer layer 30. The first crests 52 are aligned with the counter electrode walls 32 respectively. The first troughs 54 are aligned with the support walls 34 respectively. The first corrugated conductive diaphragm 50 may be made of electrically conductive material or comprise an insulating membrane with electrically conductive elements provided thereon. For example, the first corrugated conductive diaphragm 50 comprises a Silcon Nitride membrane with PolySilicon electrodes formed on the surface of the diaphragm 50 facing the spacer layer 30 for providing conduction.

The second corrugated conductive diaphragm 70 comprises a plurality of second crests 72 and second troughs 74 arranged alternately in the second direction. The second crests 72 are sunk from the second troughs 74 in a direction toward the spacer layer 30. A second groove 76 is accordingly formed at a surface of the second crest 72 away from the spacer layer 30. The second troughs 74 are aligned with counter electrode walls 32 respectively. The second crests 72 are aligned with the support walls 34 respectively. Preferably, the second corrugated conductive diaphragm 70 is symmetrical with the first corrugated conductive diaphragm 50 about the spacer layer 30. The second corrugated conductive diaphragm 70 may be made of electrically conductive material or comprise an insulating membrane with electrically conductive elements provided thereon. For example, the second corrugated conductive diaphragm 70 comprises a Silcon Nitride membrane with PolySilicon electrodes formed on the surface of the diaphragm 70 facing the spacer layer 30 for providing conduction.

Figure 2A:
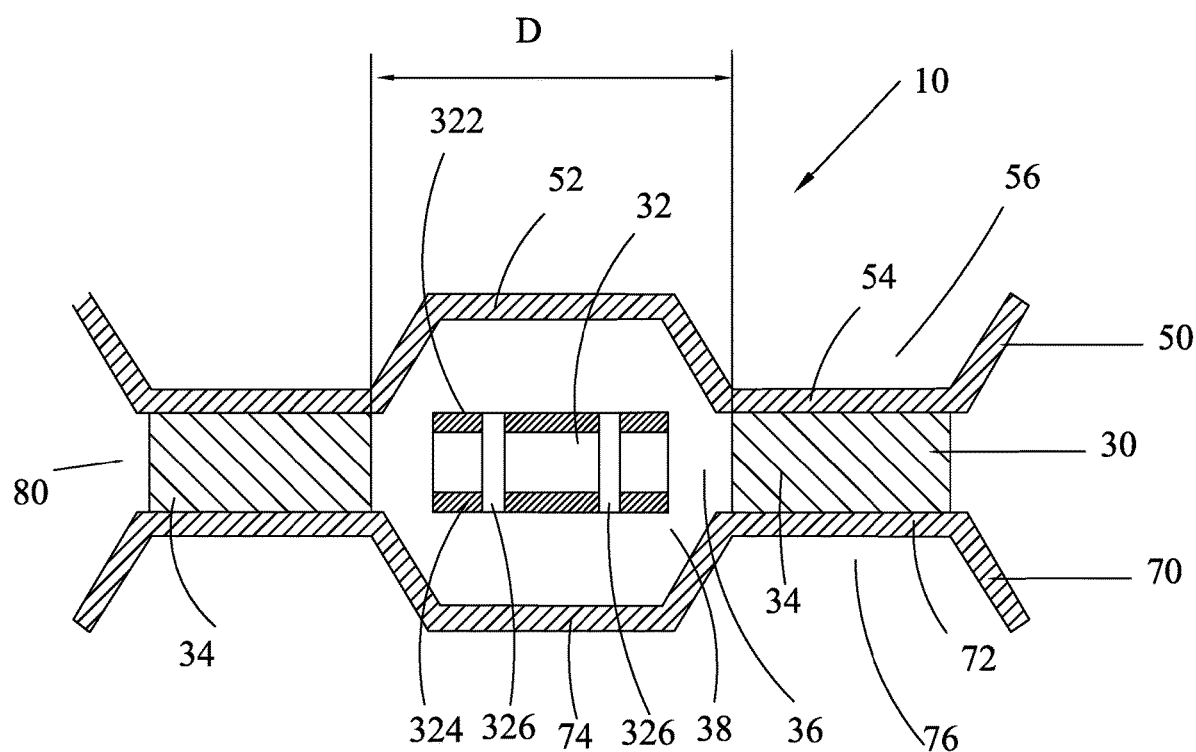
FIG. 2a is a cross-sectional view of a portion of the microelectromechanical system according to another exemplary embodiment of the present disclosure.
Figure 3:
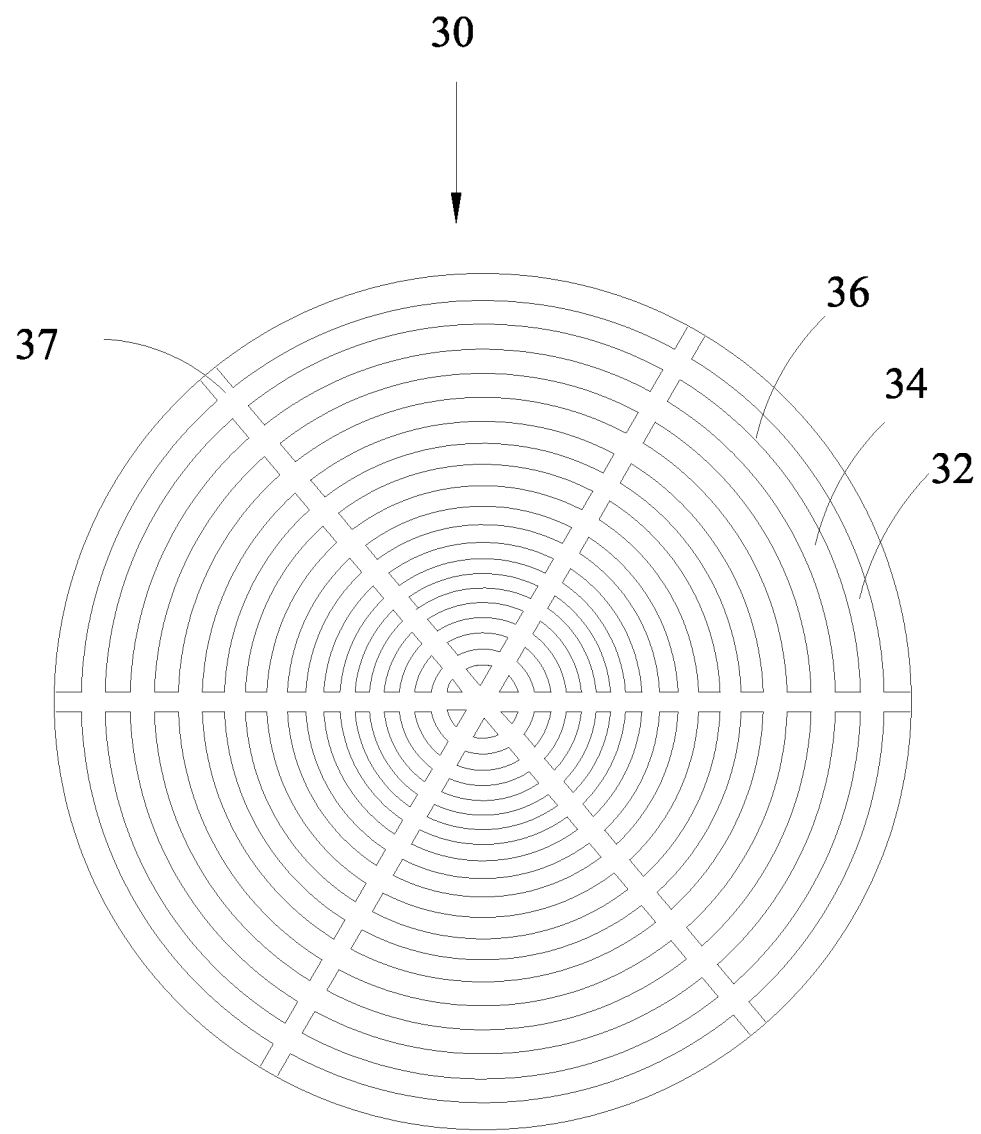
FIG. 3 illustrates a spacer layer of the microelectromechanical system of FIG. 1.

The first troughs 54 and the second crests 72 respectively contact with opposite surface of the support walls 34. That is, the support walls 34 are respectively sandwiched between the corresponding first troughs 54 and second crests 72. Chambers 38 are respectively formed between the aligned first crests 52, second troughs 74 and adjacent support walls 34. In some embodiments, the chambers 38 are sealed to external atmosphere and vacuum. Alternatively, the pressure inside the chambers 38 can be in a reduced atmosphere, for example, less than 0.2 atm. In some embodiments, the pressure inside the chambers 38 is equal to 0.1 atmosphere pressure. The counter electrode walls 32 are suspended in the corresponding sealed chambers 38 by the spokes 37. The first crests 52 are spaced from the electrically conductive elements 322 of the counter electrode walls 32 such that a first capacitance is formed therebetween. The second troughs 74 are spaced from the electrically conductive elements 324 of the corresponding counter electrode walls 32 such that a second capacitance is formed therebetween. The first crests 52 and the second troughs 74 are displaceable relative to the corresponding counter electrode walls 32 in response to a pressure exerted thereon to thereby change the distances between the first crests 52 and the second troughs 74 and the corresponding counter electrode walls 32 of the spacer layer 30 which results in the capacitances changing and electrical signal output accordingly. Alternatively, the counter electrode wall 32 comprises a single conductor such that a first capacitance is formed between the first corrugated conductive diaphragm 50 and the single conductor and a second capacitance is formed between the second corrugated conductive diaphragm 50 and the single conductor. In some embodiments, the counter electrode wall 32 is perforated with slits or holes 326 as shown in FIG. 2a. The slits or holes 326 are configured to facilitate air/gas to pass through the counter electrode wall 32.

Preferably, the counter electrode walls 32 and the support walls 34 are arc-shaped and arranged in concentric arcs which span less than 360 degrees. The first crests 52 and troughs 54 and the second crests 72 and troughs 74 are arc-shaped and arranged in concentric arcs which span less than 360 degrees. In this embodiment, the spacer layer 30, first corrugated conductive diaphragm 50 and second corrugated conductive diaphragm 70 are circular. The spoke 58 is very narrow and each slot 36, first crest 52, first trough 54, second crest 72 and second trough 74 spans substantially 60 degrees. That is, the first corrugated conductive diaphragm 50 is divided into six sections in the circumferential direction thereof. Each section comprises a group of first crests 52 and first troughs 54 arranged alternately in a radial direction of the first corrugated conductive diaphragm 50. Adjacent sections are connected with each other via a spoke 58 which extends along a diameter direction of the first corrugated conductive diaphragm 50. Preferably, the first troughs 54 are evenly arranged in the radial direction of the first corrugated conductive diaphragm 50. The distance D between adjacent support walls 34 is greater than 20 um. Accordingly, the second corrugated conductive diaphragm 70 is divided into six sections each comprising a group of second crests 72 and second troughs 74 arranged in a radial direction of the second corrugated conductive diaphragm 70. Adjacent sections are connected with each other via a spoke (not shown) which extends along a diameter direction of the second corrugated conductive diaphragm 70. Preferably, the second troughs 74 are evenly arranged in a radial direction of the second corrugated conductive diaphragm 70. The spacer layer 30 is divided into six sections each comprising a group of concentric arc-shaped counter electrode walls 32 and support walls 34 arranged in a radial direction of the spacer layer 30. Adjacent sections are connected with each other via the spoke 37 which extends along a diameter direction of the spacer layer 30. Opposite ends of the arc-shaped counter electrode walls 32 are respectively connected to the corresponding spoke 37 such that the counter electrode walls 32 are respectively suspended between adjacent spokes. The support walls 34 are disconnected from the counter electrode walls 32 and the spokes 37 by the slots 36. Alternatively, the spacer layer 30, first corrugated conductive diaphragm 50 and second corrugated conductive diaphragm 70 can be divided into other number of sections, for example four sections or eight sections and so on. The sections can be evenly or unevenly arranged in the radial direction of the microelectromechanical system 10. In some other embodiments, the spacer layer 30, first corrugated conductive diaphragm 50 and second corrugated conductive diaphragm 70 may have other shapes, such as square, hexagonal, octagonal and so on.

The spacer layer 30 is accommodated in the cavity 80 formed between the first and second corrugated conductive diaphragms 50, 70. The periphery of the first and second corrugated conductive diaphragms 50, 70 may be anchored to the base of the electro-acoustic conversion device 100. In this embodiment, the first corrugated conductive diaphragm 50 is an upper diaphragm and the second corrugated conductive diaphragm 70 is a lower diaphragm which is mounted on a substrate (not shown).

In the present disclosure, the corrugated structure formed in the thin diaphragms 50, 70 facilitate to increase acoustic compliance of microphones applying the microelectromechanical system 10 of the present disclosure due to reduction of the residual stress within the diaphragms 50, 70. The first troughs 54 and second crests 72 of the diaphragms 50, 70 are connected together via the corresponding support walls 34 of the spacer layer 30. Thus, no additional connecting pillar/post is needed to stiffen the diaphragms 50, 70. The first and second diaphragms 50, 70 are brought much closer together, and so the second moment inertial is lower.

The outer surfaces of the first crests 52 and second troughs 74 away from the spacer layer 30 are configured to receive the atmospheric pressure. In the cross section parallel to the displacement direction of the diaphragms 50, 70, the outer surfaces of the first crests 52 and second troughs 74 are slightly arcuate and anchored on both sides by adjacent troughs 54, crests 74, which makes the microelectromechanical system 10 much less susceptible to deformation due to the atmospheric pressure. This allows thinner material to be used for the diaphragms 50, 70 with the same level of deformation as current microelectromechanical systems, which leads to a more compliant structure.

The microelectromechanical system according to the above embodiment of the present disclosure has a high level of acoustic compliance (diaphragm displacement under an acoustic load) while being resistant to the deformation due to the high pressure differential between the reduced pressure within the enclosed volume and the atmosphere pressure. This high acoustic compliance allows a high microphone sensitivity.

Figure 4:
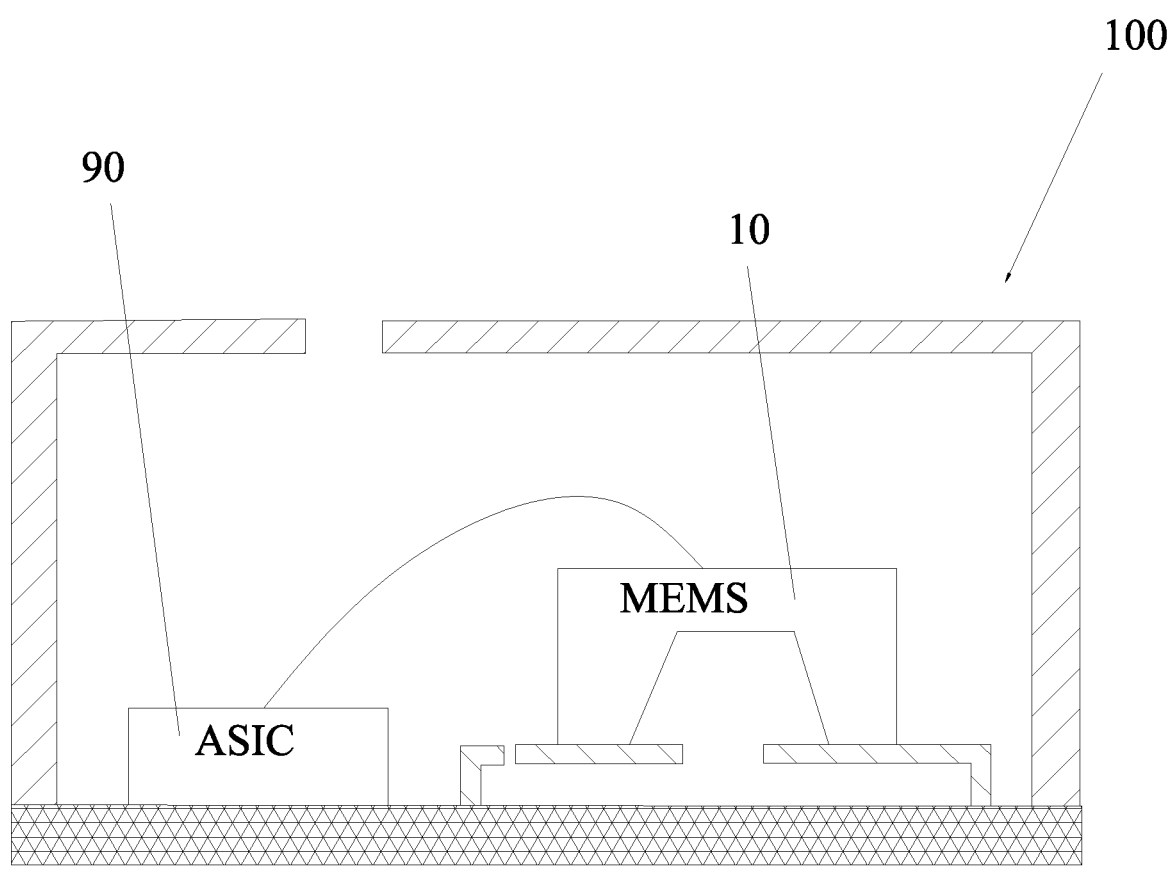
FIG. 4 illustrates an electro-acoustic conversion device applying the microelectromechanical system of FIG. 1.

FIG. 4 illustrates an electro-acoustic conversion device 100 applying the microelectromechanical system 10. The electro-acoustic conversion device 100 further comprises an Application Spicecific Integrated Circuit (ASIC) 90 electrically connected with the microelectromechanical system 10. The electro-acoustic conversion device 100 may be a microelectromechanical system microphone or speaker.

Although the invention is described with reference to one or more embodiments, the above description of the embodiments is used only to enable people skilled in the art to practice or use the invention. It should be appreciated by those skilled in the art that various modifications are possible without departing from the spirit or scope of the present invention. The embodiments illustrated above should not be interpreted as limits to the present invention, and the scope of the invention is to be determined by reference to the claims that follow.

What is claimed is:

1. A microelectromechanical system comprising:
a spacer layer comprising a plurality of counter electrode walls and support walls extending along a first direction, the counter electrode walls and support walls being arranged alternately in a second direction, slots being formed between adjacent counter electrode walls and support walls to separate the support walls from the counter electrode walls respectively;
a first corrugated conductive diaphragm comprising a plurality of first crests and first troughs arranged alternately in the second direction; and
a second corrugated conductive diaphragm comprising a plurality of second crests and second troughs arranged alternately in the second direction;
wherein the first corrugated conductive diaphragm and the second corrugated conductive diaphragm are respectively located at opposite sides of the spacer layer to cooperatively form a cavity, the first crests respectively aligned with the second troughs and the first troughs respectively aligned with the second crests;

the spacer layer is received in the cavity with the support walls respectively sandwiched between the aligned first troughs and second crests;

chambers are respectively formed between the aligned first crests and second troughs and adjacent support walls; and the counter electrode walls are respectively suspended in corresponding chambers.

2. The microelectromechanical system of claim 1, wherein the chambers are hermetically sealed, with an inside pressure less than an external atmosphere.

3. The microelectromechanical system of claim 2, wherein the inside pressure of the chambers is less than 0.2 atm.

4. The microelectromechanical system of claim 3, wherein the chambers are vacuum.

5. The microelectromechanical system of claim 1, wherein the first corrugated conductive diaphragm is made of electrically conductive material or comprises an insulating membrane with conductive elements provided thereon; and/or the second corrugated conductive diaphragm is made of electrically conductive material or comprises an insulating membrane with conductive elements provided thereon.

6. The microelectromechanical system of claim 5, wherein the counter electrode wall comprises a single conductor such that a first capacitance is formed between the first corrugated conductive diaphragm and the single conductor and a second capacitance is formed between the second corrugated conductive diaphragm and the single conductor.

7. The microelectromechanical system of claim 5, wherein the counter electrode wall comprises a first surface facing the first corrugated conductive diaphragm and a second surface facing the second corrugated conductive diaphragm, conductive elements being respectively disposed on the first and second surfaces such that a first capacitance is formed between the first corrugated conductive diaphragm and the conductive elements disposed on the first surface of the spacer layer and a second capacitance is formed between the second corrugated conductive diaphragm and the conductive elements disposed on the second surface of the spacer layer.

8. The microelectromechanical system of claim 1, wherein the first crests and troughs are evenly distributed in the second direction.

9. The microelectromechanical system of claim 1, wherein the first crests and troughs are unevenly distributed in the second direction.

10. The microelectromechanical system of claim 1, wherein distances between adjacent support walls are greater than 20 um.

11. The microelectromechanical system of claim 1, wherein the first corrugated conductive diaphragm further comprises a plurality of spokes extending along the second direction, each of the first crests and the first troughs which are arranged alternately in the second direction is extended between two adjacent spokes in the first direction to thereby form a spider shape.

12. The microelectromechanical system of claim 1, wherein the first crests and troughs are arranged in concentric arcs.

13. The microelectromechanical system of claim 7, wherein the first crests and first troughs extend arcuately along the first direction, adjacent first crests being spaced from each other and adjacent first troughs being spaced from each other such that a spoke extending along the second direction is formed therebetween.

14. The microelectromechanical system of claim 13, wherein each of the first crests and troughs spans an arc having an angle of 30 to 90 degrees.

15. The microelectromechanical system of claim 13, wherein the first corrugated conductive diaphragm has a circular configuration and comprises a plurality of sections each comprising a group of first crests and first troughs arranged alternately in the second direction, adjacent sections being connected with each other via a spoke which extends along a diameter direction of the first corrugated conductive diaphragm.

16. The microelectromechanical system of claim 1, wherein a first groove is formed at a surface of the first trough away from the spacer layer.

17. The microelectromechanical system of claim 1, wherein the spacer layer further comprises a plurality of spokes extending in the second directions, the counter electrode walls being respectively connected between adjacent spokes, the support walls being disconnected from the counter electrode walls and the spokes by the slots.

18. The microelectromechanical system of claim 1, wherein the spacer layer has a circular configuration and comprises a plurality of sections each comprising a group of the counter electrode walls and support walls being arranged alternately in the second direction, adjacent sections being connected with each other via a spoke which extends along a diameter direction of the spacer layer, the counter electrode walls being respectively connected between adjacent spokes, the support walls being disconnected from the counter electrode walls and the spokes by the slots.

19. The microelectromechanical system of claim 1, wherein the counter electrode wall is perforated with slits or holes.

20. An electro-acoustic conversion device comprising the microelectromechanical system of claim 1, and an ASIC electrically connected to the microelectromechanical system.

* * * * *